United States Patent [19]

Matsuzaki

[11] Patent Number: 5,789,782
[45] Date of Patent: *Aug. 4, 1998

[54] LATERAL SEMICONDUCTOR DEVICE WITH MAXIMIZED BREAKDOWN VOLTAGE, AND METHODS OF FIXING POTENTIAL OF SAME

[75] Inventor: Kazuo Matsuzaki, Nagano, Japan

[73] Assignee: Fuji Electric Co., Ltd., Tokyo, Japan

[*] Notice: The term of this patent shall not extend beyond the expiration date of Pat. No. 5,631,491.

[21] Appl. No.: 794,146

[22] Filed: Feb. 3, 1997

Related U.S. Application Data

[62] Division of Ser. No. 530,003, Sep. 19, 1995, Pat. No. 5,631,491.

[30] Foreign Application Priority Data

Sep. 27, 1994 [JP] Japan ............................ 6-230882

[51] Int. Cl.$^6$ .......................... H01L 27/01; H01L 23/58
[52] U.S. Cl. .......................... 257/347; 257/487
[58] Field of Search .......................... 257/347, 487, 257/488

[56] References Cited

U.S. PATENT DOCUMENTS

5,554,872  9/1996  Baba et al. .......................... 257/342

*Primary Examiner*—Steven H. Loke
*Attorney, Agent, or Firm*—Baker & Botts, L.L.P.

[57] ABSTRACT

A lateral semiconductor device with enhanced breakdown characteristics includes a semiconductor substrate composite of first and second semiconductor substrates bonded to one another via an oxide film. An insulation film is buried in a separation trench which extends from a major surface of the first semiconductor substrate to the oxide film. An element region of greater than 10 μm in thickness is isolated by the separation trench from other element regions. First and second diffusion regions of opposite conductivity type are formed on the element region. The potential of the second substrate is fixed at one-third of the designed maximum breakdown voltage of the lateral semiconductor device. Alternatively, if the element region is 10 μm or less in thickness, the potential of the second substrate is fixed at one-half of the designed maximum breakdown voltage of the lateral semiconductor device.

6 Claims, 5 Drawing Sheets

LATERAL SEMICONDUCTOR DEVICE WITH MAXIMIZED BREAKDOWN VOLTAGE, AND METHODS OF FIXING POTENTIAL OF SAME

This is a divisional of application Ser. No. 08/530,003 filed on Sep. 19, 1995, now U.S. Pat. No. 5,631,491.

BACKGROUND OF THE INVENTION

The present invention relates to lateral semiconductor devices, and to methods of driving such devices.

In lateral semiconductor devices, carriers flow parallel to major device surfaces, and signals are input and output through electrodes disposed on one major surface. Such lateral semiconductor devices may be contrasted with vertical semiconductor devices in which the carriers flow perpendicularly to the semiconductor substrate. The latter are used especially as so-called power devices, i.e., semiconductor devices for handling electric power in high-power semiconductor apparatuses.

Vertical semiconductor devices have been used mainly based on breakdown voltage considerations. The breakdown voltage $V_B$ of a semiconductor device may be expressed by Equation 1:

$$V_B = \tfrac{1}{2} \cdot E_{Crit} \cdot L_D \qquad (1)$$

where $L_D$ is "drift length" or width of a depletion layer when a voltage is applied across a junction, and $E_{Crit}$ is the critical electric field strength of the junction. When the electric field strength inside the device exceeds the critical strength $E_{Crit}$, breakdown occurs. The value of $E_{Crit}$ depends on the shape and method of forming the junction, and on impurity concentration and other factors. Mainly, however, it depends on the drift length $L_D$. With adequate thickness, and without requiring excessive lateral chip size, the vertical device is superior for high-breakdown-voltage devices because it permits greater expansion of a depletion layer.

Recently, single-chip power ICs having power devices and an IC monolithically integrated have attracted increased attention. In order to match the manufacturing process of the power devices to that of the IC, such power devices are being configured in lateral form.

Figure 6:
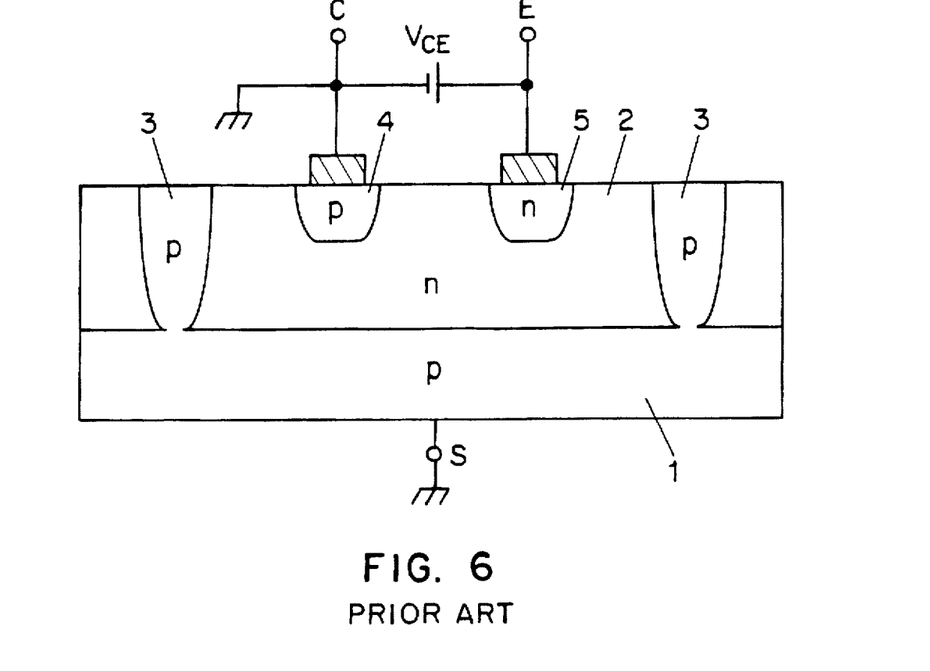
FIG. 6 is a cross section of a prior-art p-n junction separation-type semiconductor device.

FIG. 6 is a cross section of a power IC with p-n junction separation. The power IC has a p-type substrate 1 on which an element region 2 is formed by epitaxial growth. The element region 2 is isolated by a p-type separation region 3 which surrounds the element region 2 from its surface down to the substrate 1. A p-type diffusion region 4 and an n-type diffusion region 5 corresponding respectively to a collector region and an emitter region of a bipolar transistor are formed in the element region 2. Electrodes respectively connected to terminals C and E are disposed on the diffusion regions 4 and 5. A bias voltage $V_{CE}$ is applied between the terminals C and E. Usually, the minimum potential of the power supply voltage of the power IC is applied to the p-type substrate 1. For example, when the power supply voltage is ±15 V, a voltage of −15 V is applied to the substrate 1. Or, when the power supply voltage is ±15 V, a bias voltage of 0 V (GND) is applied to the substrate 1.

In FIG. 6, the negative terminal of the bias power supply $V_{CE}$ and an S terminal of the substrate 1 are grounded, and the potential of the substrate 1 is fixed at 0 V (GND). Such biasing creates a reverse-biased junction between the p-type substrate 1 and the n-type diffusion region 5, thereby isolating the substrate 1 from the element region 2 by a depletion layer. This biasing scheme is disclosed in Japanese Patent Publication No. S40-17410.

Two major drawbacks of the conventional p-n junction separation and biasing scheme described above are the parasitic-element effect and the limited breakdown voltage of an element. Though the p-type substrate 1 and the p-type separation region 3 are fixed at the minimum potential of the element region 2, they may form a pnp parasitic transistor, for example, causing thyristor or latch-up operation of the element.

To improve the breakdown voltage of the ICs which employ p-n junction separation, the thickness of the n-type epitaxial layer in the element region 2 must be increased, as equation 1 indicates. However, as the thickness of the epitaxial layer increases, the p-type separation region 3 should be diffused more deeply. This deep diffusion causes wide lateral diffusion, using up lateral device area. Consequently, it is difficult to achieve high-breakdown voltage in the device.

To avoid these drawbacks, new techniques have been sought for increasing the breakdown voltage at reduced area requirements for lateral element separation. A so-called "perfect dielectric separation structure" has been proposed that combines a semiconductor substrate composite including semiconductor substrates bonded with one another via an oxide film. Such semiconductor devices, and a method for increasing the breakdown voltage of the semiconductor device are disclosed in Japanese Laid Open Patent Application No. H04-336446 and in European Patent Publication No. 0513764 A2 (hereinafter referred to as "cited prior art").

Figure 7:
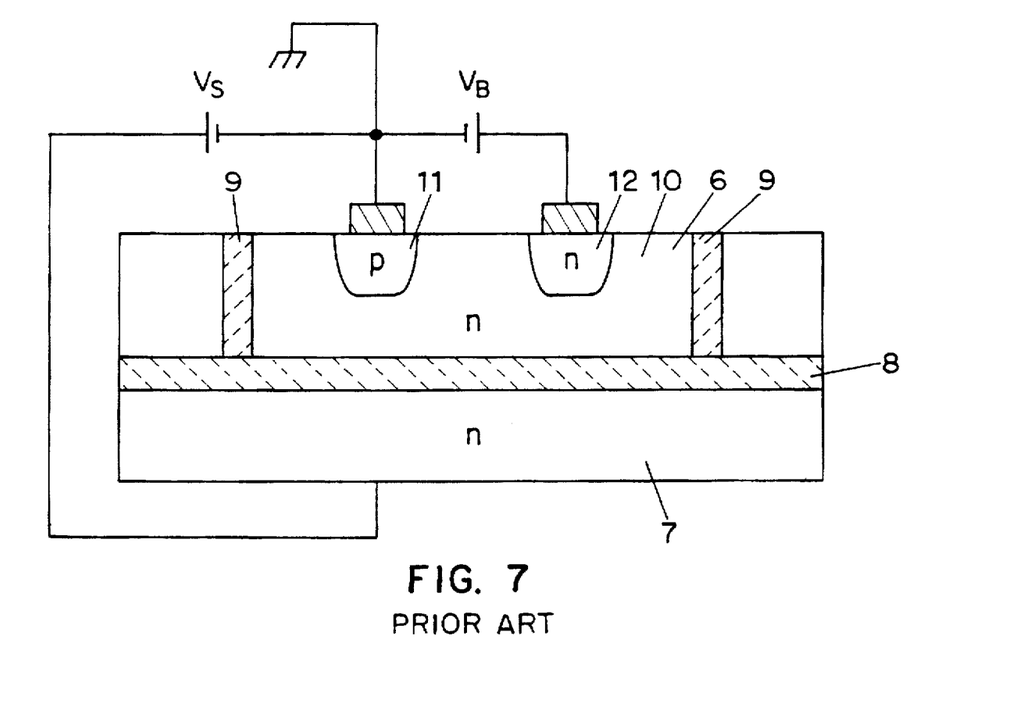
FIG. 7 is a cross section of a part of a prior-art perfect dielectric separation-type semiconductor device.

FIG. 7 is a cross section of a part of the perfect dielectric separation-type semiconductor device disclosed in the cited prior art. The semiconductor device includes a semiconductor substrate composite including a first semiconductor substrate 6 and a second semiconductor substrate 7 bonded with one another via an oxide film 8. A separation trench 9 in which insulator is buried is dug from the surface of the substrate 6 down to the oxide film 8. A p-type diffusion region 11 and an n-type diffusion region 12 are formed in an element region 10 isolated from other element regions. The breakdown voltage $V_B$ of the semiconductor device of FIG. 7 is thereby improved by fixing the potential $V_S$ of the second semiconductor substrate 7 to be higher than the minimum potential inside the element region 10 formed in the first substrate 6, i.e., the ground potential connected to the p-type diffusion region 11.

Though the conventional method of increasing a device breakdown voltage of the semiconductor device shown in FIG. 7 may be useful, the semiconductor device cannot be manufactured in accordance with desired specifications as no method of designing the breakdown voltage has been known. The cited prior art points to the problem. For example, it mentions that the substrate potential is determined "by a trial approach", and that the substrate potential which maximizes the breakdown voltage can be determined "once the semiconductor device is determined."

SUMMARY OF THE INVENTION

It is an object of the present invention to provide a semiconductor device with maximized breakdown voltage. It is a further object of the invention to provide a method of fixing the potential of the semiconductor device that is best suited for improving the device breakdown voltage.

According to an aspect of the invention, a lateral semiconductor device comprises a semiconductor substrate composite comprising a first semiconductor substrate of thickness d and a second semiconductor substrate bonded with one another via an oxide film, a separation trench having an insulation film buried therein, the separation trench extending from a major surface of the first semiconductor substrate to the oxide film, an element region isolated by the separation trench from other element regions, a first diffusion region of a first conductivity type formed on the element region, spaced from the separation trench by a distance $L_G$, and a second diffusion region of a second conductivity type formed on the element region, spaced from the separation trench by a distance $L_C$, and spaced from the first diffusion region by a distance $L_D$, where the thickness and the distances are such that $L_G \geq (L_D-d)$.

According to a further aspect of the invention, a method is provided for fixing a potential of a lateral semiconductor device comprising a semiconductor substrate composite comprising a first semiconductor substrate and a second semiconductor substrate bonded with one another via an oxide film, a separation trench having an insulation film buried therein, the separation trench extending from a major surface of the first semiconductor substrate to the oxide film, an element region of 10 µm or more in thickness thereof, the element region being isolated by the separation trench from other element regions, a first diffusion region of a first conductivity type formed on the element region, and a second diffusion region of a second conductivity type formed on the element region, the method comprising a step of fixing the potential of the second substrate to be one-third of the maximum breakdown voltage of the lateral semiconductor device.

According to still another aspect of the invention, a method is provided for fixing a potential of a lateral semiconductor device comprising a semiconductor substrate composite comprising a first semiconductor substrate and a second semiconductor substrate bonded with one another via an oxide film, a separation trench having an insulation film buried therein, the separation trench extending from a major surface of the first semiconductor substrate to the oxide film, an element region of 10 µm or less in thickness thereof, the element region being isolated by the separation trench from other element regions, a first diffusion region of a first conductivity type formed on the element region, and a second diffusion region of a second conductivity type formed on the element region, the method comprising a step of fixing the potential of the second substrate to be one-half of the maximum breakdown voltage of the lateral semiconductor device.

It is preferred to bury polycrystalline silicon in the separation trench, and to apply a potential bias higher than the minimum potential of the element region to the polycrystalline silicon. It is preferred also to a apply the same potential bias to the polycrystalline silicon as to the second substrate.

BRIEF DESCRIPTION OF THE DRAWINGS

The invention will be described in detail hereinafter with reference to the accompanied drawings which illustrate embodiments of the invention, wherein.

DETAILED DESCRIPTION

The influence of the substrate potential $V_S$ on the device structure may be described as follows. When a junction exists in the element region 10, the expansion width $X_D$ of the depletion layer expanding from the oxide film 8 is expressed by Equation 2:

$$X_D = \{2\epsilon_{si}/((V_B-V_S)+2\phi_{Fn})(qN_D)^{-1}\}^{1/2} \quad (2)$$

where q is the electron charge, $N_D$ is the impurity concentration in the first semiconductor substrate 6, $\epsilon_{Si}$ is the dielectric constant of silicon, $\phi_{Fn}$ is the Fermi potential of the element region, $V_B$ is the reverse bias voltage (breakdown voltage), and $V_S$ is the substrate potential of the second semiconductor substrate 7.

Mechanism 1. By Equation 2, applying $V_S$ reduces the expansion width $X_D$ of the depletion layer. Accordingly, applying $V_S$ increases the breakdown voltage by $V_S$ with respect to the breakdown voltage $V_{B0}$ at zero substrate potential ($V_S$=0). That is, $$V_B = V_{B0} + V_S \quad (3)$$
$$= E_{Crit} \cdot d - q \cdot N_D \cdot d^2/(2\epsilon_{Si}) + V_S$$

where d is the thickness of the first semiconductor substrate 6.

Mechanism 2. The electric field strength of the depletion layer is at a maximum at the corner of the depletion layer. In the structure of FIG. 7 especially, the electric field strength may be related to the electric field across the oxide film 8. When a potential bias $V_S$ is applied to the second semiconductor substrate 7, the electric field strength in the vicinity of the n-type diffusion region 12 is expressed by Equation 4, and the electric field strength in the vicinity of the p-type diffusion region 11 by Equation 5:

$$E_{Crit}(n) = \alpha(V_B^* - V_S)/d_{OX} \quad (4)$$

$$E_{Crit}(p) = \alpha \cdot V_S/d_{OX} \quad (5)$$

where $\alpha$ is a geometrical correction factor, $V_B^*$ is a breakdown voltage according to Mechanism 2, and $d_{OX}$ is the thickness of the oxide film 8 between the first and second semiconductor substrates 6 and 7. Equations 4 and 5 show that the potential $V_S$ of the second semiconductor substrate determines whether the vicinity or the n-type diffusion region 12 or the vicinity of the p-type diffusion region 11 determines the breakdown voltage.

Mechanism 1 corresponds to the case in which the thickness d of the first semiconductor substrate 6 determines the breakdown voltage. Mechanism 2 corresponds to the case in which the thickness $d_{OX}$ of the oxide film and the radius of curvature of the diffusion region 11 or 12 determine the breakdown voltage.

In the case of Mechanism 1, $V_B \leq V_B^*$ holds. Therefore $$E_{Crit}(n)d_{OX}/\alpha - E_{Crit} \cdot d + qN_D d^2/(2\epsilon_{Si}) \geq 0 \quad (6)$$

Generally, the thickness d of the first semiconductor substrate that satisfies Equation 6 is $d \leq 10$ μm. In the usual case in which the substrate impurity concentration $N_D$ is low, the maximum breakdown voltage then is given as follows:

$$\begin{aligned} V_B &= V_{B0} + V_S \\ &= E_{Crit} \cdot d - q \cdot N_D \cdot d^2/(2\epsilon_{Si}) + V_S \\ &\approx E_{Crit} \cdot d + V_S \end{aligned}$$

Since the maximum breakdown voltage occurs when $V_B = V_B^*$, $V_B^*$ in Equation 4 is substituted by $V_B$:

$$E_{Crit}(n) d_{ox}/\alpha = E_{Crit} \cdot d$$

$$\alpha/d_{ox} = E_{Crit}(n)/(E_{Crit} \cdot d)$$

Since, typically, $E_{Crit}(n) = E_{Crit}(p)$:

$$V_S = E_{Crit} \cdot d$$

by Equation 5. Therefore, by Equation 3:

$$V_B = 2V_S \qquad (7)$$

On the other hand, if the breakdown voltage is determined by Mechanism 2, a relation $V_B \geq V_B^*$ holds. Accordingly, $$E_{Crit}(n) d_{ox}/\alpha - E_{Crit} \cdot d + q N_D d^2/(2\epsilon_{Si}) \leq 0 \qquad (8)$$

Generally, the thickness d of the first semiconductor substrate that satisfies Equation 8 is $d \geq 10$ μm. Accordingly, in the case of Mechanism 2, the maximum breakdown voltage is determined by $E_{Crit}(n) = E_{Crit}(p)$, and $$V_B^* = 2V_S$$

$$V_S = \frac{1}{2} V_B^*$$

The maximum breakdown voltage then is given as follows:

$$\begin{aligned} V_{Bmax} &= E_{Crit} \cdot d - q \cdot N_D \cdot d^2/(2\epsilon_{Si}) + V_S \\ &= E_{Crit} \cdot d - q \cdot N_D \cdot d^2/(2\epsilon_{Si}) + 1/2 V_B^* \\ &\approx E_{Crit} \cdot d + 1/2 V_B^* \end{aligned}$$

Since the first semiconductor substrate is fully depleted when the breakdown voltage is determined by Mechanism 2, the breakdown voltage is determined by the potential concentrated in the oxide film 8:

$$V_B^* = E_{Crit} \cdot d$$

$$V_{Bmax} = 3V_S \qquad (9)$$

Hereinafter, the case in which the maximum breakdown voltage is determined by Mechanism 1 is referred to as "double effect", and the case in which the maximum breakdown voltage is determined by Mechanism 2 as "triple effect".

By setting the spacing $L_G$ between the diffusion regions and the insulation trench, the thickness d of the first semiconductor substrate, and the spacing $L_D$ between the diffusion regions so that the condition $L_G \geq (L_D - d)$ is met, the breakdown voltage of the dielectric separation-type semiconductor device is improved.

If an element region of 10 μm or more in thickness is formed on the second semiconductor substrate, breakdown voltage of the device is maximized by applying a potential to the second semiconductor substrate which is one-third of the designed maximum breakdown voltage of the device. If an element region of 10 μm or less in thickness is formed on the second semiconductor substrate, breakdown voltage of the device is maximized by applying a potential to the second semiconductor substrate which is one-half of the designed maximum breakdown voltage of the device.

The breakdown voltage of the dielectric separation type semiconductor device is improved also by filling the separation trench with polycrystalline silicon, and by applying a potential bias higher than the minimum potential of the element region, e.g., as high as the potential of the semiconductor substrate.

Figure 1:
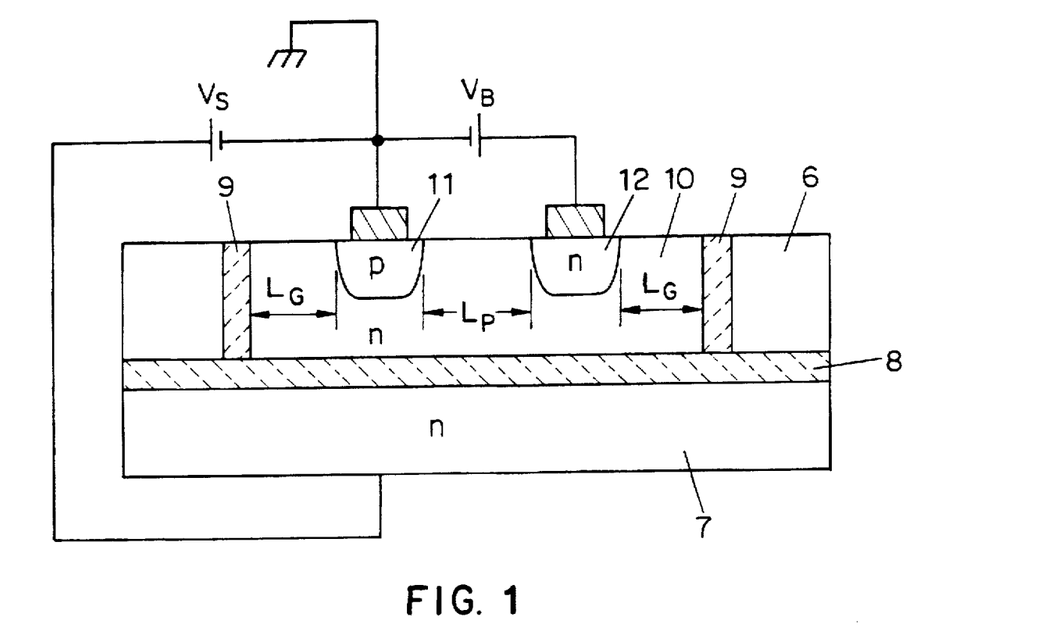
FIG. 1 is a cross section of a first embodiment of a perfect dielectric separation-type semiconductor device according to the invention.

FIG. 1 is a cross section of a first embodiment of a perfect dielectric separation-type semiconductor device according to the invention. The semiconductor device of FIG. 1 includes a semiconductor substrate composite including a first semiconductor substrate 6 and a second semiconductor substrate 7 bonded with one another via an oxide film 8. A separation trench 9 in which an insulator is buried is dug from the surface of the first substrate 6 down to the oxide film 8. A p-type diffusion region 11 and an n-type diffusion region 12 are formed in an element region 10 isolated from other element regions. The breakdown voltage $V_B$ is improved by fixing the potential $V_S$ of the second semiconductor substrate 7 to be higher than the minimum potential inside the element region 10 formed in the first substrate 6, i.e., higher than the ground potential connected to the p-type diffusion region 11.

The parameters of an experimental embodiment in accordance with FIG. 1 are as follows: the thickness d of the first semiconductor substrate 6 is 10 μm or 30 μm, the impurity concentration of the first semiconductor substrate is $1 \times 10^{14}$ cm$^{-3}$ (n-type), the dose amount of the p-type diffusion region is $1 \times 10^{15}$ cm$^{-2}$, and the dose amount of the n-type diffusion region is $3.1 \times 10^{15}$ cm$^{-2}$. The diffusion depth of the p-type diffusion region 11 is set at 1.5 μm and 3.5 μm for investigating the effect of the radius of curvature of the diffusion regions. And the drift length $L_D$ between the diffusion regions 11 and 12 is set at a constant 70 μm.

Figure 3:
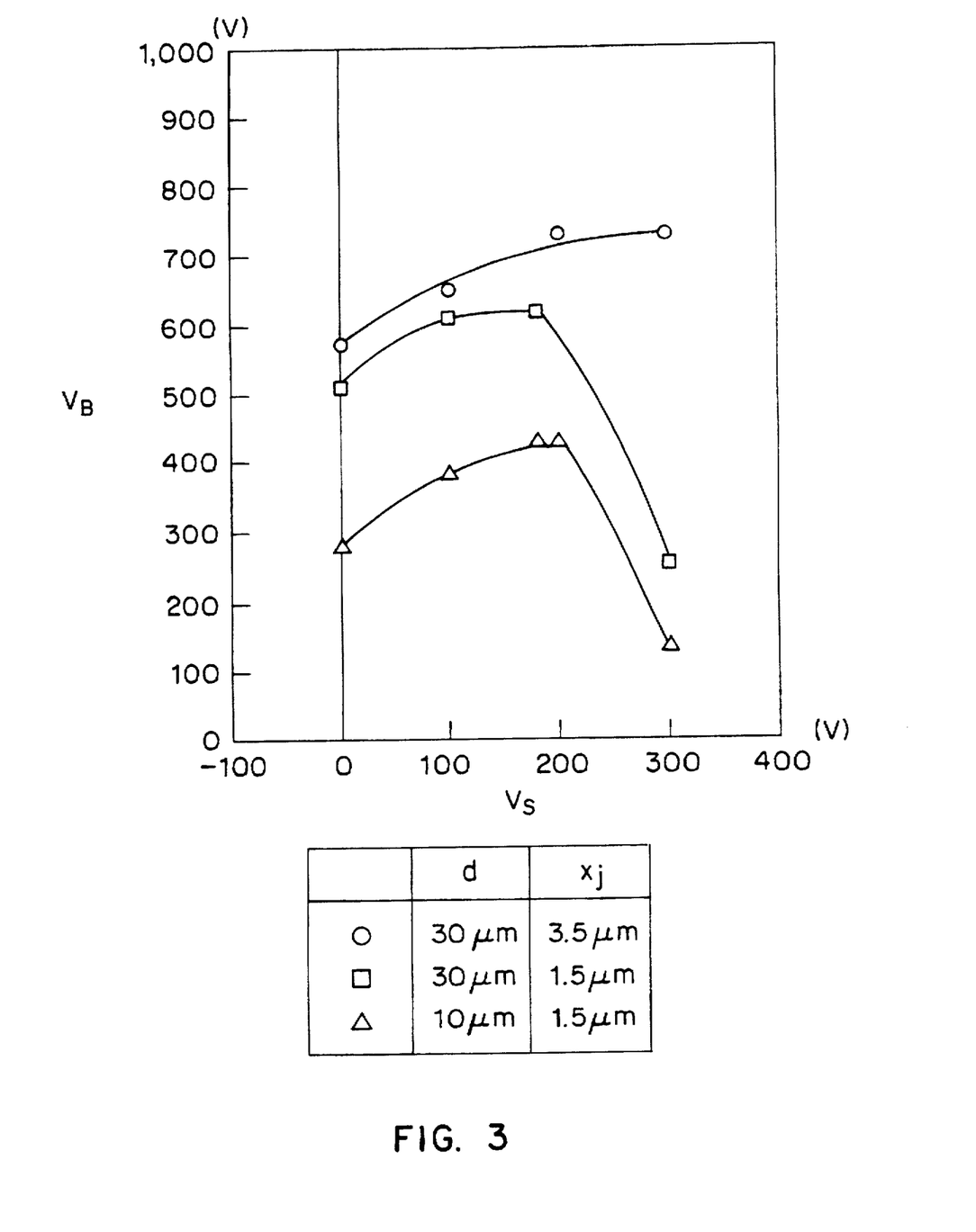
FIG. 3 is a graph relating breakdown voltage of the device to the potential of the second semiconductor substrate.

FIG. 3 is a graph relating breakdown voltage $V_B$ of the device to potential $V_S$ of the second semiconductor substrate. Though the breakdown voltage $V_B$ increases at first with increasing substrate potential $V_S$, $V_B$ shows a peak, and decreases as $V_S$ increases further. When the thickness of the first substrate is 10 μm (indicated by △ symbols), the value of the substrate potential $V_S$ at which the breakdown voltage $V_B$ shows a peak corresponds to one-half of the peak value of the breakdown voltage $V_B$. When the thickness of the first substrate is 30 μm (indicated by □ or ○ symbols), the value of the substrate potential $V_S$ at which the breakdown voltage $V_B$ shows a peak corresponds to one-third of the peak value of the breakdown voltage $V_B$. These experimental results are in good agreement with the theoretical prediction. Accordingly, instead of designing the breakdown voltage of the device after setting the substrate potential as in the prior art, the dimensions of the device can be determined after selecting the breakdown voltage of the device.

Figure 4:
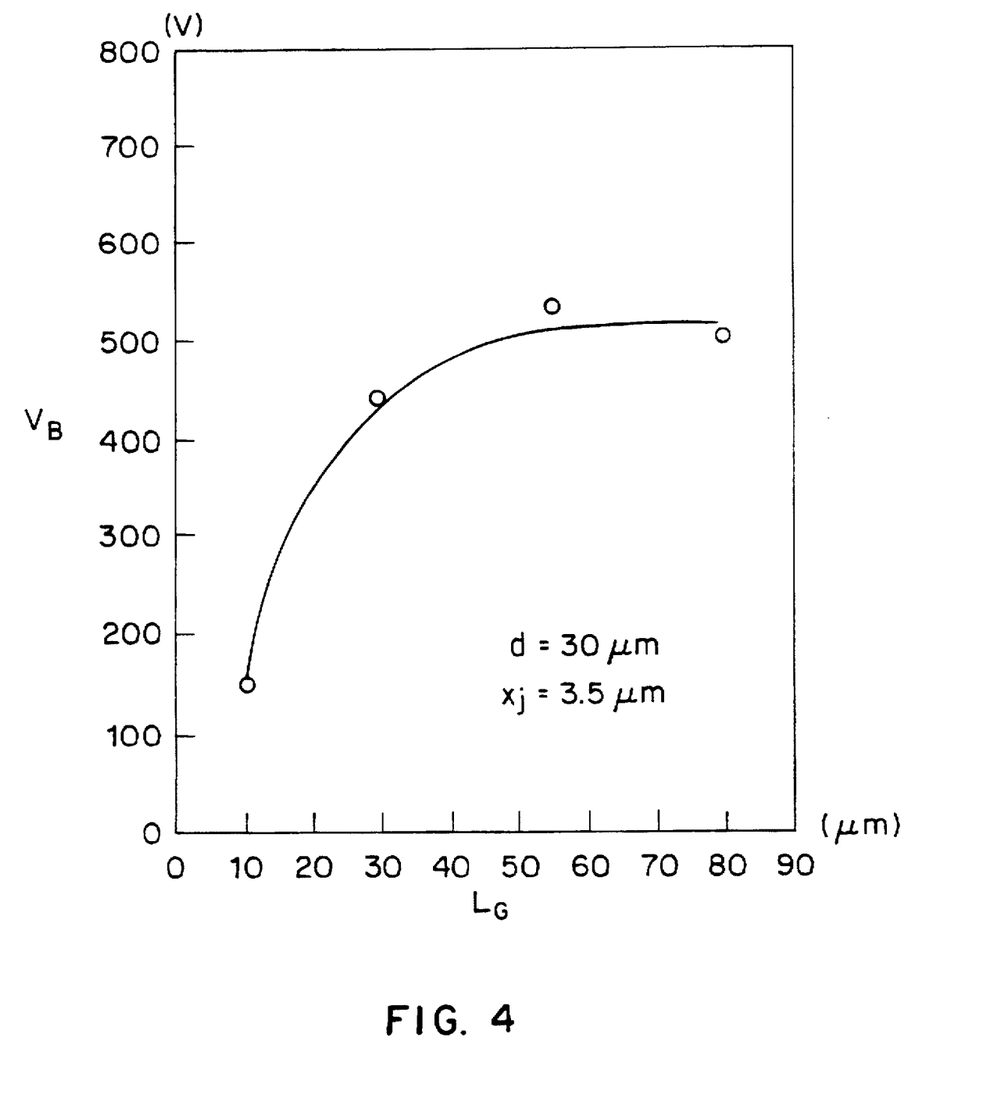
FIG. 4 is a graph relating distance between the n-type diffusion region and the separation trench to the breakdown voltage of the device of FIG. 1.

FIG. 4 is a graph relating distance $L_G$ between the n-type diffusion region 12 and the separation trench 9 to breakdown voltage $V_B$ of the device of FIG. 1. The breakdown voltage $V_B$ increases as distance $L_G$ increases and almost saturates beyond a certain distance (40 μm in this case). Repeated experiments conducted by the present inventor have revealed a condition expressed by the following equation under which a high-breakdown voltage is realized in the device structure of FIG. 1:

$$L_G \geq L_D - d \qquad (10)$$

Thus, the breakdown voltage of the dielectric separation-type semiconductor device is improved by setting the distance $L_G$ between the diffusion regions and the insulation trench, the thickness d of the first semiconductor substrate, and the drift length $L_D$ between the diffusion regions so that the condition $L_G \geq (L_D-d)$ is met.

Figure 2:
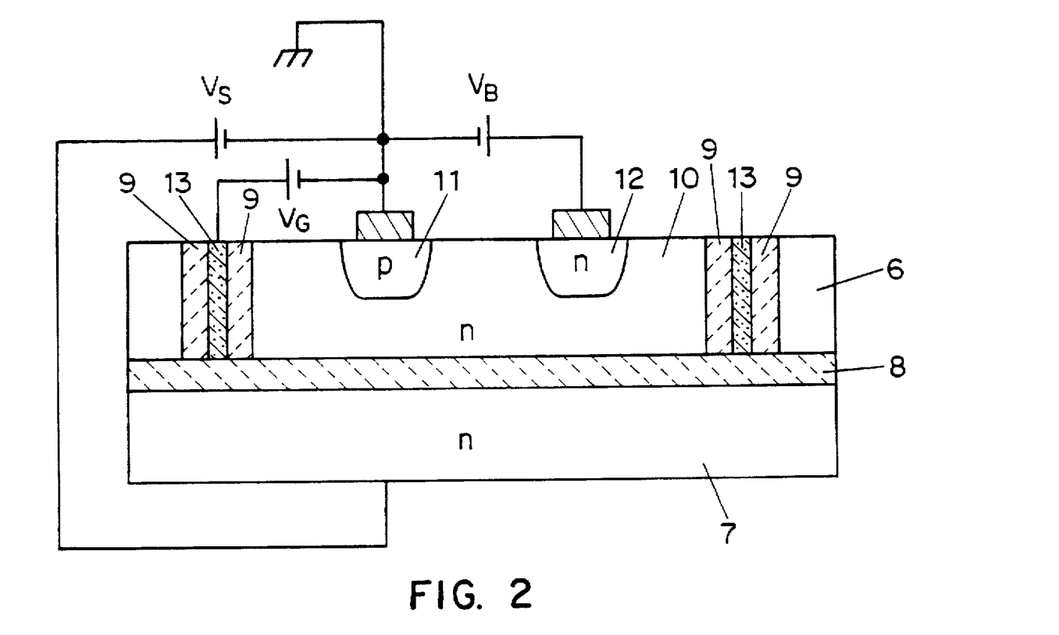
FIG. 2 is a cross section of a second embodiment of a perfect dielectric separation-type semiconductor device according to the invention.

FIG. 2 is a cross section of a second preferred embodiment of a perfect dielectric separation-type semiconductor device. The second embodiment differs from the first embodiment in that polycrystalline silicon 13 is inserted into the separation trench 9. Additionally, a potential bias $V_G$ is applied to the polycrystalline silicon 13. The value of the potential bias $V_G$ may be the same as or different from the value of the potential $V_S$ of the second substrate 7.

Figure 5A:
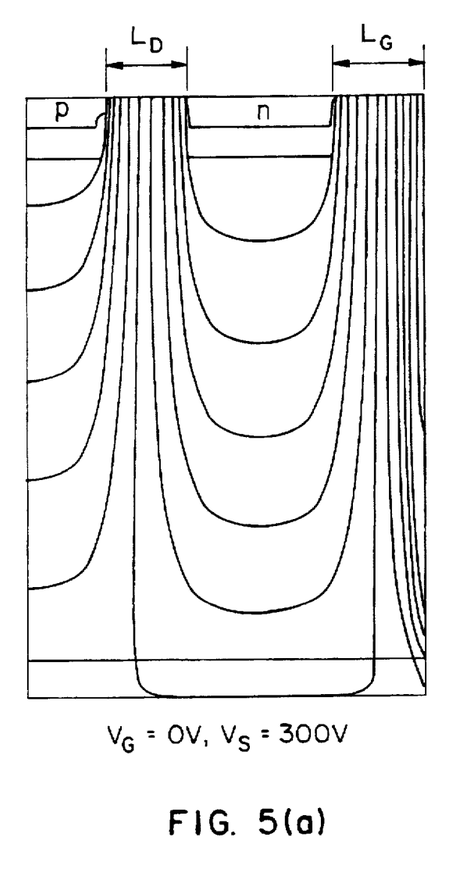
FIG. 5(a) is a graph showing potential distribution in the semiconductor device of FIG. 2, in which a potential bias is not applied to the polycrystalline silicon.

FIG. 5(a) is a graph showing a potential distribution in the semiconductor device of FIG. 2, in which a potential bias is not applied to the polycrystalline silicon 13.

Figure 5B:
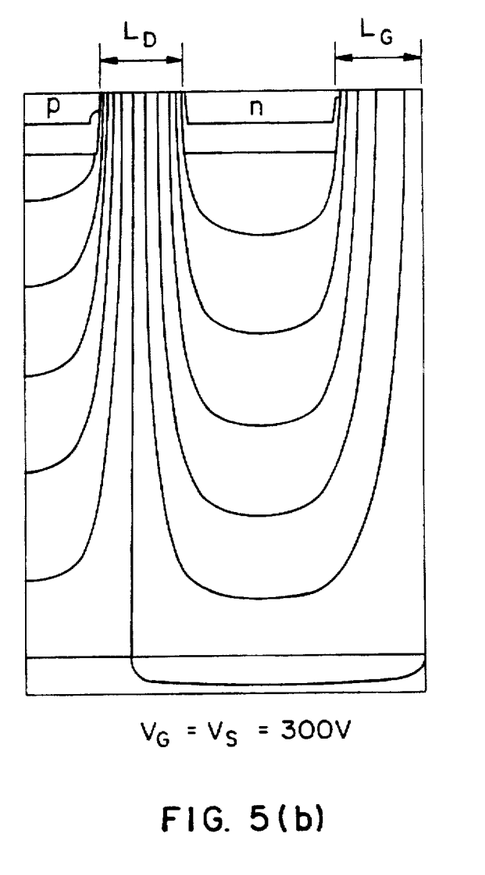
FIG. 5(b) is a graph showing potential distribution in the semiconductor device of FIG. 2, in which the same potential bias is applied to the polycrystalline silicon as to the second substrate 7.

FIG. 5(b) is a graph showing a potential distribution in the semiconductor device of FIG. 2, in which a potential bias $V_G$ equal to the potential $V_S$ of the second substrate 7 is applied to the polycrystalline silicon 13. The curves in the figures represent iso-potential curves drawn at increments of 50 V. The potential bias $V_G$ applied to the polycrystalline silicon 13 functions similarly as the potential bias $V_S$ applied to the second substrate 7. The potential bias $V_G$ applied to the polycrystalline silicon 13 moderates the potential gradient, and is especially effective to realize a high-breakdown voltage when the condition of Equation 10 is not satisfied.

According to a further aspect of the present invention, a method is provided for fixing the potential of a lateral semiconductor device having a maximum breakdown voltage $V_B$. The lateral semiconductor device includes a semiconductor substrate composite comprised of a first semiconductor substrate and a second semiconductor substrate mutually bonded to an oxide film. The first semiconductor substrate includes an element region isolated from other element regions by an insulator region extending from a major surface of the first semiconductor substrate to the oxide film, a first diffusion region of a first conductivity type disposed on the element region, and a second diffusion region of a second conductivity type disposed on the element region. The method for fixing the potential of the above-described lateral semiconductor device includes the step of fixing the potential $V_S$ of the second substrate at one-half the maximum breakdown voltage $V_B$ of the lateral semiconductor device when the thickness of the element region is less than or equal to 10 µm.

According to another aspect of the present invention, a second method is provided for fixing the potential of the above-described lateral semiconductor device. The method includes the step of fixing the potential $V_S$ of the second substrate at one-third the maximum breakdown voltage $V_B$ when the thickness of the element region is greater than 10 µm.

According to a further aspect of the present invention, wherein the element region has a minimum potential and wherein the insulator region in part consists of polycrystalline silicon, it is advantageous to fix the polycrystalline silicon at a potential bias higher than the minimum potential of the element region. It is also advantageous to apply the same potential bias to the polycrystalline silicon and the second-semiconductor-substrate.

I claim:

1. A method of fixing the potential of a lateral semiconductor device, said lateral semiconductor device including a semiconductor substrate composite having a maximum breakdown voltage and first and second semiconductor substrates mutually bonded to an oxide film, wherein said first semiconductor substrate comprises an element region which has a thickness less than or equal to 10 µm and which is isolated from other element regions by an insulator region extending from a major surface of said first semiconductor substrate to said oxide film, a first diffusion region of a first conductivity type disposed on said element region, and a second diffusion region of a second conductivity type also disposed on said element region, said method comprising the step of fixing said second substrate at a potential which is one-half of said maximum breakdown voltage.

2. The method of claim 1, wherein the element region has a minimum potential, wherein the insulator region in part consists of polycrystalline silicon, and wherein the method further comprises fixing the polycrystalline silicon at a potential bias higher than the minimum potential of the element region.

3. The method of claim 2, wherein the potential bias of the polycrystalline silicon equals second-semiconductor-substrate potential.

4. A method of fixing the potential of a lateral semiconductor device, said lateral semiconductor device including a semiconductor substrate composite having a maximum breakdown voltage and first and second semiconductor substrates mutually bonded to an oxide film, wherein said first semiconductor substrate comprises an element region which has a thickness greater than 10 µm and which is isolated from other element regions by an insulator region extending from a major surface of said first semiconductor substrate to said oxide film, a first diffusion region of a first conductivity type disposed on said element region, a second diffusion region of a second conductivity type also disposed on said element region, said method comprising the step of fixing said second substrate at a potential which is one-third of said maximum breakdown voltage.

5. The method of claim 4, wherein the element region has a minimum potential, wherein the insulator region in part consists of polycrystalline silicon, and wherein the method further comprises fixing the polycrystalline silicon at a potential bias higher than the minimum potential of the element region.

6. The method of claim 5, wherein the potential bias of the polycrystalline silicon equals second-semiconductor-substrate potential.

* * * * *

UNITED STATES PATENT AND TRADEMARK OFFICE
CERTIFICATE OF CORRECTION

PATENT NO. : 5,789,782

DATED : August 4, 1998

INVENTOR(S) : Kazuo Matsuzaki

It is certified that error appears in the above-identified patent and that said Letters Patent is hereby corrected as shown below:  On the title page, item [54] and column 1, line 4   "POTENTIAL" should read --POTENTIALS--;

Column 1, line 58, "±15 V." should read -- +15 V--.

Signed and Sealed this

Twenty-second Day of June, 1999

Attest:

Q. TODD DICKINSON

*Attesting Officer*   Acting Commissioner of Patents and Trademarks